(12) United States Patent
Kusunose (10) Patent No.: US 9,117,869 B2
(45) Date of Patent: Aug. 25, 2015

(54) CHUCKING DEVICE AND CHUCKING METHOD

(71) Applicant: Lasertec Corporation, Yokohama, Kanagawa (JP)

(72) Inventor: Haruhiko Kusunose, Kanagawa (JP)

(73) Assignee: LASERTEC CORPORATION, Kanagawa (JP)

( * ) Notice: Subject to any disclaimer, the term of this patent is extended or adjusted under 35 U.S.C. 154(b) by 28 days.

(21) Appl. No.: 14/148,475

(22) Filed: Jan. 6, 2014

(65) Prior Publication Data
US 2014/0189998 A1    Jul. 10, 2014

(30) Foreign Application Priority Data

Jan. 8, 2013    (JP) .................................. 2013-000965

(51) Int. Cl.
*B25J 15/06*    (2006.01)
*H01L 21/683*    (2006.01)

(52) U.S. Cl.
CPC ....... *H01L 21/6838* (2013.01); *Y10T 29/49998* (2015.01); *Y10T 279/11* (2015.01)

(58) Field of Classification Search
CPC .. H01L 21/6838; B25B 5/061; B25B 11/005; B25B 11/007; B23Q 1/0018; Y10T 279/11; Y10T 29/49998
USPC ....................................................... 294/64.3
See application file for complete search history.

(56) References Cited

U.S. PATENT DOCUMENTS

| | | | |
|---|---|---|---|
| 6,702,302 B2* | 3/2004 | Smedt et al. .................. | 279/106 |
| 6,786,996 B2* | 9/2004 | Emami ...................... | 156/345.1 |
| 6,860,801 B2* | 3/2005 | Yang et al. .................... | 451/388 |
| 7,063,499 B2* | 6/2006 | Miyamoto ................ | 414/744.8 |
| 7,168,747 B2* | 1/2007 | Hoehn et al. ................. | 294/64.3 |

FOREIGN PATENT DOCUMENTS

| | | |
|---|---|---|
| JP | H11-243135 | 9/1999 |
| JP | 2007-250601 | 9/2007 |

OTHER PUBLICATIONS

Japanese Patent Application No. 2013-000965: Office Action mailed on Feb. 12, 2014.

* cited by examiner

*Primary Examiner* — Stephen Vu
(74) *Attorney, Agent, or Firm* — Procopio, Cory, Hargreaves & Savitch LLP (57) ABSTRACT

A chucking device is provided, the chucking device having low dusting characteristics and high detergent properties, and being capable of vacuum-sucking even a substrate having a large warpage, and a chucking method using the chucking device is also provided. The chucking device vacuum-sucks and holds a wafer. The chucking device includes a perforated plate having a plurality of through-holes and being mounted with a wafer, the through-holes penetrating through both sides of the perforated plate; a porous plate that supports a surface other than a mounting surface of the perforated plate, on which the wafer is mounted, transmits a vacuum state to the wafer through the plurality of through-holes, and has a pore to limit a flow rate; and a vacuum pump that exhausts an air through the pore of the porous plate.

14 Claims, 7 Drawing Sheets

CHUCKING DEVICE AND CHUCKING METHOD

INCORPORATION BY REFERENCE

This application is based upon and claims the benefit of priority from Japanese patent application No. 2013-000965, filed on Jan. 8, 2013, the disclosure of which is incorporated herein in its entirety by reference.

BACKGROUND OF THE INVENTION

1. Field of the Invention

The present invention relates to a chucking device and a chucking method.

2. Description of Related Art

In some chucking devices that vacuum-suck a wafer, suction grooves are formed immediately below the wafer. For example, Japanese Unexamined Patent Application Publication No. 2007-250601 discloses a suction pad having suction grooves that are concentrically formed. The suction grooves are evacuated to thereby vacuum-suck a wafer. However, when the wafer has a large warpage, the vacuum leaks from an end of the wafer. As a result, the degree of vacuum cannot be increased, which makes it difficult to vacuum-suck the wafer.

Japanese Unexamined Patent Application Publication No. H11-243135 discloses a vacuum suction pad that vacuum-sucks a wafer. In the vacuum suction pad disclosed in Japanese Unexamined Patent Application Publication No. H11-243135, the vacuum suction is performed in a state where a silicon wafer is placed on a disk-shaped member formed of porous ceramics. In other words, the wafer is secured by vacuum suction through the porous ceramics.

In the vacuum suction pad disclosed in Japanese Unexamined Patent Application Publication No. H11-243135, when the wafer contacts the porous ceramics, microscopic crushing is liable to occur in the porous ceramics, resulting in generation of dust. In the porous ceramics, it is difficult to clean and eliminate foreign matters accumulated in fine recesses. Besides, it is hard to dry cleaning liquid or rinse agent entering into the porous ceramics. Furthermore, since a separate component for preventing a leakage from an end surface or a bottom surface is used, it is necessary to bond the separate component to the porous ceramics with an adhesive. However, the use of an adhesive makes it difficult to perform acid cleaning. Thus, when porous ceramics are used, it is difficult to improve detergent properties.

The present invention has been made in view of the above-mentioned problems, and an object of the present invention is to provide a chucking device having low dusting characteristics and high detergent properties and capable of vacuum-sucking even a substrate having a large warpage, and a chucking method using the same.

SUMMARY OF THE INVENTION

A chucking device according to a first aspect of the present invention is a chucking device that vacuum-sucks and holds a substrate. The chucking device includes: a first plate having a plurality of through-holes and being mounted with a substrate, the plurality of through-holes penetrating through both sides of the first plate; a member that supports a surface other than a substrate mounting surface of the first plate, transmits a vacuum state to the substrate through the plurality of through-holes, and limits a conductance; and an exhaust unit that exhausts an air through a pore of the member. This leads to an improvement of detergent properties. This configuration enables vacuum-sucking of a wafer having a warpage.

In the chucking device described above, the first plate is preferably formed of a dense material. This leads to an improvement of detergent properties.

In the chucking device described above, the member is preferably formed of a porous material. This enables uniform vacuum-sucking and reliable chucking of the substrate. Consequently, even a substrate having a warpage can be vacuum-sucked.

Further, the member may have an orifice or a pore to limit a conductance.

The chucking device described above may further include a second plate having a plurality of through-holes and disposed on a side of the member opposite to the first plate. The exhaust unit may vacuum-suck the substrate through the through-holes of the second plate. This configuration enables use of a flexible porous member and chucking of a substrate having a warpage.

In the chucking device described above, the member may be a sheet-like member having a thickness smaller than that of the first and second plates. This configuration enables reliable chucking of a substrate having a large warpage.

In the chucking device described above, the member is preferably a PTFE membrane. This enables the PTFE membrane to function as a filter, thereby preventing contamination due to particles.

In the chucking device described above, the member may be a porous ceramic plate.

A chucking method according to a second aspect of the present invention is a chucking method using the chucking device described above.

According to the present invention, it is possible to provide a chucking device having low dusting characteristics and high detergent properties and capable of vacuum-sucking even a substrate having a large warpage, and a chucking method using the same.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Embodiments of the present invention will be described below with reference to the drawings. Preferred embodiments of the present invention will be described below, but the scope of the present invention is not limited by the following embodiments. In the following description, elements denoted by the same reference numerals indicate substantially the same elements. Further, in the following description, a state in which a wafer is horizontally disposed on a chucking device will be described, for clarity of the explanation. However, the top-and-bottom positional relationship varies depending on the positional relationship between the wafer and the chucking device.

First Embodiment

Figure 1:
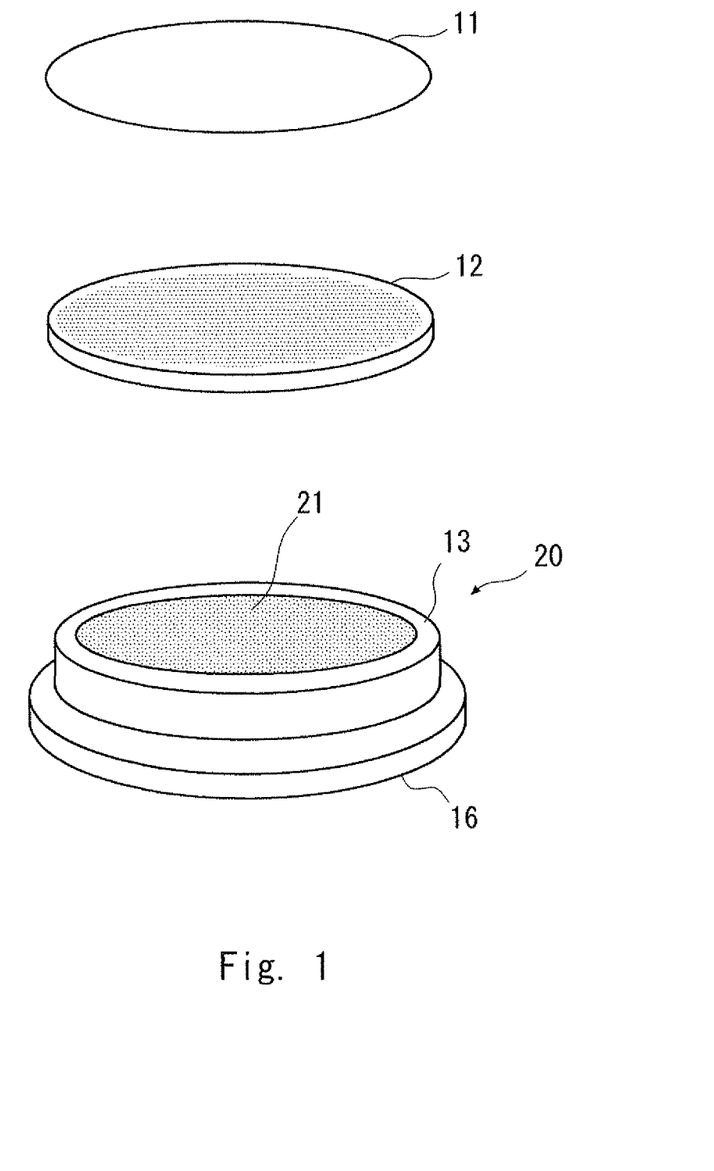
FIG. 1 is a perspective view for explaining each component of a chucking device according to a first embodiment.
Figure 2:
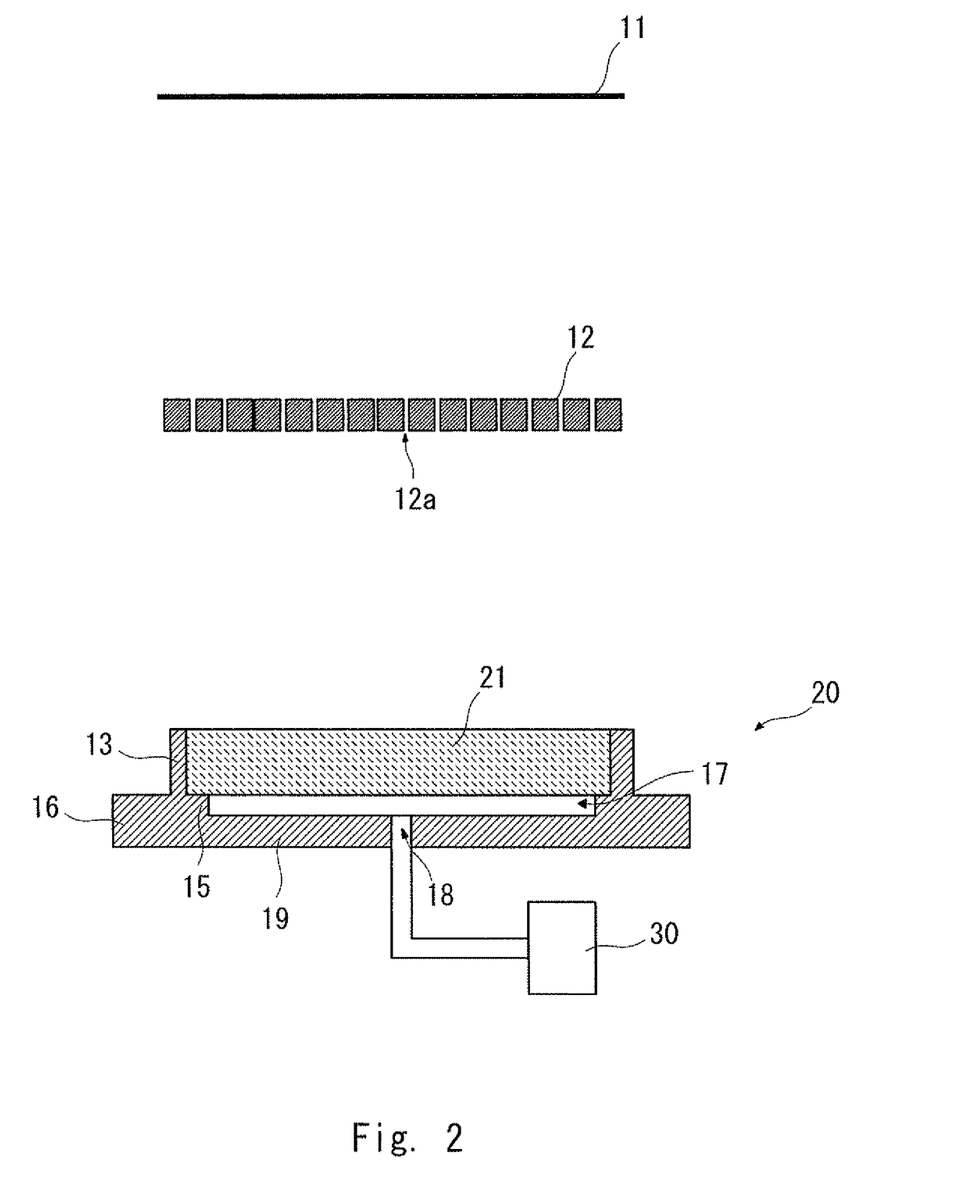
FIG. 2 is a sectional view schematically showing each component of the chucking device according to the first embodiment.

A chucking device and a chucking method according to a first embodiment will be described with reference to FIGS. 1 and 2. FIG. 1 is a perspective view for explaining each component of the chucking device. FIG. 2 is a sectional view schematically showing each component of the chucking device. FIGS. 1 and 2 illustrate that the members are spaced apart as needed. As shown in FIGS. 1 and 2, in order to vacuum-suck a substrate, such as a wafer 11, the chucking device includes a perforated plate 12, a support portion 20, and a vacuum pump 30.

The wafer 11 is, for example, a silicon wafer, which is a flat plate. The wafer 11 is disposed on the perforated plate 12. The perforated plate 12 is a first plate having a plurality of through-holes 12a formed therein. In other words, the perforated plate 12 is a perforated plate having the through-holes 12a. The perforated plate 12 is a flat plate and has a disk shape corresponding to the wafer 11. The through-holes 12a penetrate from an upper surface to a lower surface of the perforated plate 12. The through-holes 12a are uniformly distributed over substantially the entire area of the perforated plate 12. For example, the plurality of through-holes 12a are arranged at regular intervals over substantially the entire area of the perforated plate 12 except for a peripheral portion thereof. The upper surface of the perforated plate 12 is a mounting surface (loading surface) on which the wafer 11 is placed. Specifically, the wafer 11 is vacuum-sucked in a state where the upper surface of the perforated plate 12 and the lower surface of the wafer 11 are in contact with each other. The perforated plate 12 is detachably supported by the support portion 20.

The support portion 20 serves as a pedestal that supports a porous plate 21. The porous plate 21 is a disk-shaped member formed of porous ceramics. Oilless metal using sintered metal, for example, can also be used as the porous plate 21. The support portion 20 includes a side wall 13, a step portion 15, a peripheral portion 16, and a bottom portion 19. The step portion 15, the bottom portion 19, and the peripheral portion 16 are disposed below the side wall 13. The bottom portion 19 and the step portion 15 are disposed inside the annular side wall 13, and the peripheral portion 16 is disposed outside the side wall 13. The support portion 20 is formed of, for example, a metallic material.

The side wall 13 is provided to house the porous plate 21. That is, the porous plate 21 is housed in a space whose outer peripheral is surrounded by the side wall 13. The outer peripheral surface of the porous plate 21 comes into contact with the side wall 13, thereby sealing a space. The porous plate 21 and the side wall 13 may be joined by an adhesive. The porous plate 21 and the side wall 13 are formed such that the heights of the upper surfaces thereof substantially match. The upper surfaces of the porous plate 21 and the side wall 13 serve as a mounting surface on which the perforated plate 12 is placed. The lower surface of the perforated plate 12 and the upper surface of the porous plate 21 are in contact with each other.

The peripheral portion 16 extends to the outer periphery side of the side wall 13. The peripheral portion 16 is fixed to a stage table (not shown) by a screw or the like. The bottom portion 19 is provided inside the side wall 13. The formation of the step portion 15 enables formation of a space between the bottom portion 19 and the porous plate 21. The porous plate 21 is placed on the step portion 15. Accordingly, a space 17 is provided between the porous plate 21 and the bottom portion 19 on the lower side of the step portion 15.

The bottom portion 19 is provided with an exhaust port 18 that communicates with the space 17. Specifically, the exhaust port 18 is connected to the space 17 that is surrounded by the porous plate 21, the step portion 15, and the bottom portion 19. The vacuum pump 30 serving as an exhaust unit exhausts air from the space 17 through the exhaust port 18.

The perforated plate 12 is placed on the porous plate 21. Specifically, the porous plate 21 is disposed on the side opposite to the wafer 11 side of the perforated plate 12. The porous plate 21 has a disk shape corresponding to the wafer 11 and the perforated plate 12. The porous plate 21 is disposed immediately below all the through-holes 12a. The wafer 11 is placed on the perforated plate 12. In other words, the plurality of through-holes 12a are covered by the wafer 11. The vacuum pump 30 exhausts air from the space 17 which is formed immediately below the porous plate 21. The through-holes 12a of the perforated plate 12 are connected to the porous plate 21 which is disposed immediately below the through-holes 12a. Accordingly, the vacuum pump 30 exhausts a gas within the through-holes 12a, which are formed immediately below the wafer 11, through the porous plate 21.

The porous plate 21 has a predetermined conductance and functions as an orifice that limits an effective exhaust velocity of the vacuum pump 30. In other words, the porous plate 21 is a member that limits the flow of the gas within the through-holes 12a which is exhausted by the vacuum pump 30. The porous plate 21 supports a surface other than the wafer mounting surface of the perforated plate 12, transmits a vacuum state to the wafer 11 through the plurality of through-holes 12a, and limits the conductance. That is, when the porous plate 21 is disposed immediately below the perforated plate 12, the conductance can be reduced to a desired conductance. A member having an orifice or a pore to limit the conductance can be used as the porous plate 21. Thus, the vacuum pump 30 exhausts air within the through-holes 12a through the pores of the porous plate 21. With this configuration, the through-holes 12a which are spaces formed immediately below the wafer 11 can be depressurized, thereby making it possible to vacuum-suck the wafer 11. That is, the wafer 11 disposed on the through-holes 12a is vacuum-sucked through the porous plate 21. The pores of the porous plate 21 limit the flow rate of the air to be exhausted. The degree of vacuum at the back surface of the wafer 11 is equal to that at the front surface of the porous plate 21 which is formed immediately below the back surface of the wafer 11. Therefore, suction characteristics using the porous plate 21 can be maintained. Consequently, the degree of vacuum (suction force) at a contact portion of the wafer 11 can be maintained, and even the wafer 11 having a large warpage can be reliably vacuum-sucked.

Since the wafer 11 is not in contact with the porous plate 21, the number of options for the material of the porous plate 21 can be increased. For example, the porous plate 21 can be formed of alumina or the like. A material that does not cause metallic contamination, such as SiC, can also be used for the perforated plate 12 in contact with the wafer 11. A dense material can be used for the perforated plate 12, which leads to a reduction in dust generation. The use of a dense material for the perforated plate 12 also facilitates cleaning. In particular, the use of SiC as the perforated plate 12 provides a high corrosion resistance and enables strong acid cleaning using sulfate, hydrofluoric acid, or the like. This improves the detergent properties. Furthermore, SiC, which has electrical conductivity, prevents electrification and suppresses generation of dust. The perforated plate 12 may be formed of other ceramic materials such as alumina and Alsima, or may be formed of materials other than ceramic materials. The perforated plate 12 is preferably formed of a denser material than that of the porous plate 21.

It is also possible to employ a structure in which only the perforated plate 12 can be easily dismounted from the support portion 20. This facilitates replacement of the perforated plate 12 when the perforated plate 12 becomes dirty. The perforated plate 12 may be fixed to the support portion 20. For example, a pin or the like is provided to the upper surface of the side wall 13, and a hole corresponding to the pin is formed at the periphery of the perforated plate 12. Then, the pin formed on the side wall 12 is inserted into the hole formed in the perforated plate 12, thereby preventing the perforated plate 12 from being shifted from the support portion 20. The perforated plate 12 may instead be fixed to the support portion 20 by a screw or the like. The perforated plate 12 does not need to be fixed to the support portion 20. In this case, the perforated plate 12 is merely placed on the porous plate 21.

The perforated plate 12 enables use of, for example, SiC that is dense and rigid. The use of denser and more rigid materials makes it possible to obtain a high flatness even when the perforated plate 12 is reduced in thickness. Since the flatness of a chuck surface does not depend on the flatness of the porous plate 21, the thickness of the porous plate 21 can be reduced. The reduction in thickness of the porous plate 21 enables use of materials having a low permeability. As a result, the wafer 11 having a large warpage can be vacuum-sucked. The reason for this will be described with reference to FIGS. 3A to 4B.

Figure 3A:
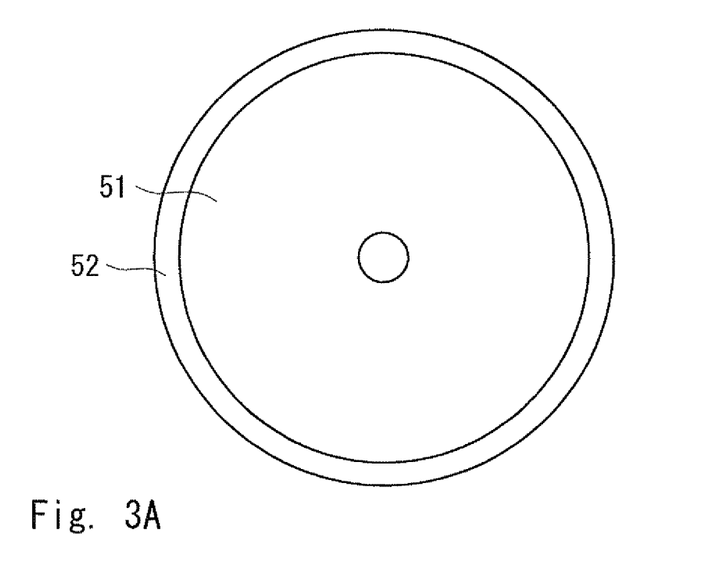
FIG. 3A is a diagram for explaining a chucking device using porous ceramics.
Figure 3B:
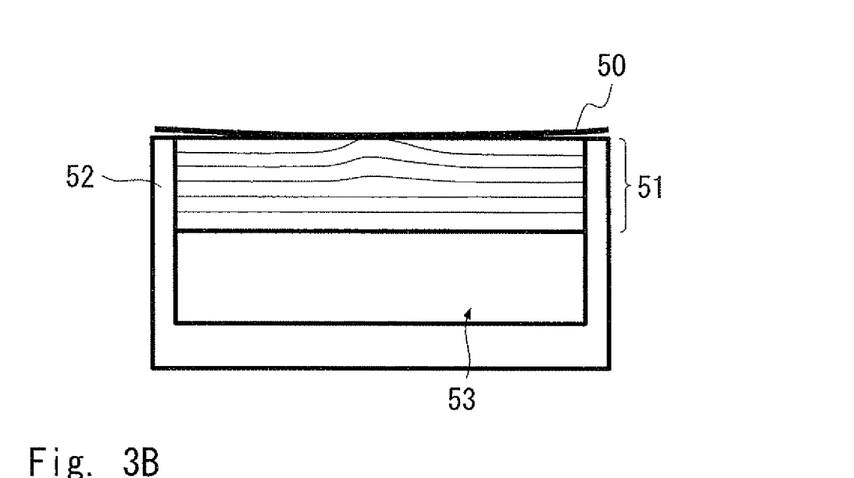
FIG. 3B is a diagram for explaining the chucking device using porous ceramics.
Figure 4A:
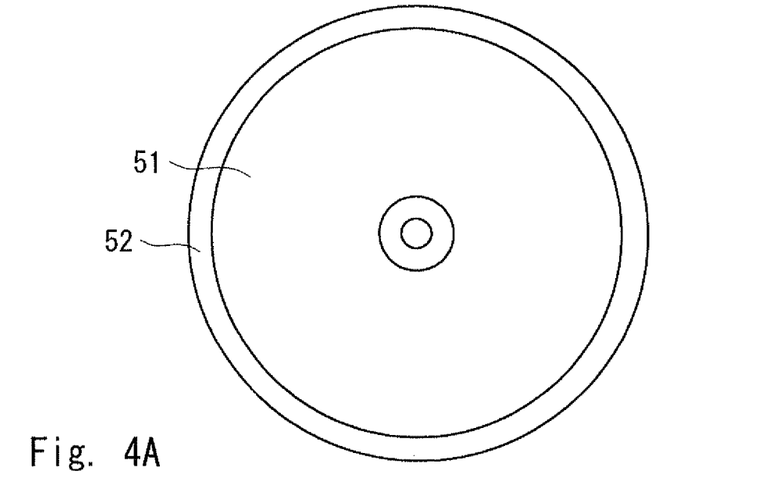
FIG. 4A is a diagram for explaining the chucking device using porous ceramics.
Figure 4B:
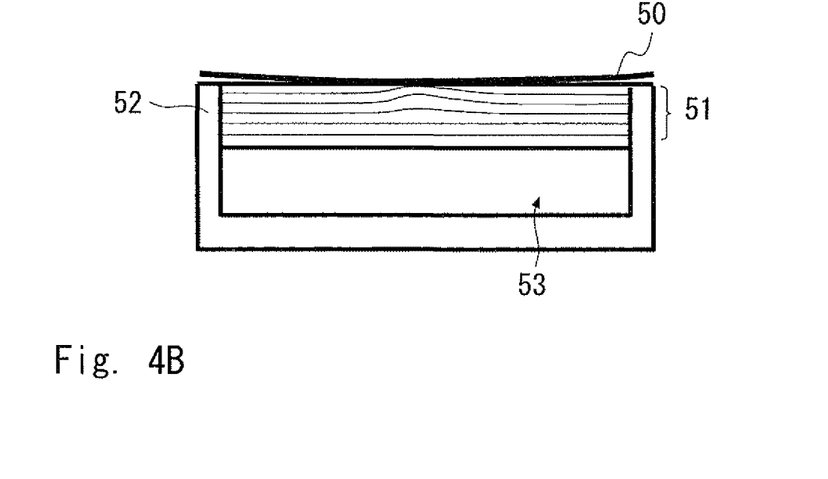
FIG. 4B is a diagram for explaining the chucking device using porous ceramics.

FIGS. 3A to 4B are diagrams each showing a configuration in which a wafer 50 is vacuum-sucked by a porous ceramic plate 51 as disclosed in Japanese Unexamined Patent Application Publication No. 2007-250601. FIGS. 3A and 4A are top views of the chucking device, and FIGS. 3B and 4B are sectional views each schematically showing the configuration in which the wafer 50 is vacuum-sucked by the porous ceramic plate 51. FIGS. 3A and 3B show the case in which the ceramic plate 51 is thick, and FIGS. 4A and 4B show the case in which the ceramic plate 51 is thin. FIGS. 3B and 4B also illustrate constant-pressure lines within the ceramic plate 51.

As shown in FIGS. 3A to 4B, the disk-shaped porous ceramic plate 51 and a side wall 52 which is formed so as to surround the outer periphery of the ceramic plate 51 are provided. A space 53 is provided below the ceramic plate 51. Air is exhausted from the space 53 by a vacuum pump (not shown) or the like. This allows the wafer 50 to be vacuum-sucked through the porous ceramic plate 51. When the constant-pressure lines are parallel to the wafer 50, the air flows in a direction perpendicular to the wafer 50. This causes a suction force on the wafer 50.

However, when the wafer 11 has a concave shape (cone shape) in a concentric fashion, for example, the wafer 50 comes into contact with the ceramic plate 51 at only the central portion of the wafer 50. In other words, a gap is formed between the wafer 50 and the ceramic plate 51 at an end of the wafer 50, and the vacuum leaks. At the central portion of the wafer 50, the constant-pressure lines have components in the direction perpendicular to the wafer 50. In this case, the gas flows in the direction parallel to the wafer 50, with the result that a sufficient suction force may not be generated at the contact portion of the wafer 50.

The porous ceramic plate 51 has a rigidity lower than that of the dense material, which makes it difficult to increase the flatness. Further, since the porous ceramic plate 51 has a low strength, the porous ceramic plate 51 needs to be increased in thickness. In the case of increasing the thickness of the ceramic plate 51, it is necessary to use a material having a relatively high permeability (porosity). Accordingly, the circulation amount of the air in a lateral direction increases. As a result, when the ceramic plate 51 is increased in thickness, the vacuum region on the contact surface of the wafer is reduced. This may make it difficult to correct the warpage and to vacuum-suck the wafer 50 having a large warpage.

On the other hand, the use of the chucking device having the configuration as shown in FIGS. 1 and 2 makes it possible to prevent the porous plate 21 and the wafer 11 from being brought into contact with each other. Since the flatness of the chucking device does not depend on the flatness of the porous plate 21, the thickness of the porous plate 21 can be reduced. This enables use of the porous plate 21 having a low permeability. This results in a reduction in the region in which the circulation amount of the air in the lateral direction is small and the degree of vacuum deteriorates due to a leakage, and an improvement in the capability of correcting the warpage of the wafer 11. Consequently, the wafer having a large warpage can be vacuum-sucked, and the wafer 11 can be reliably vacuum-sucked and held.

Second Embodiment

Figure 5:
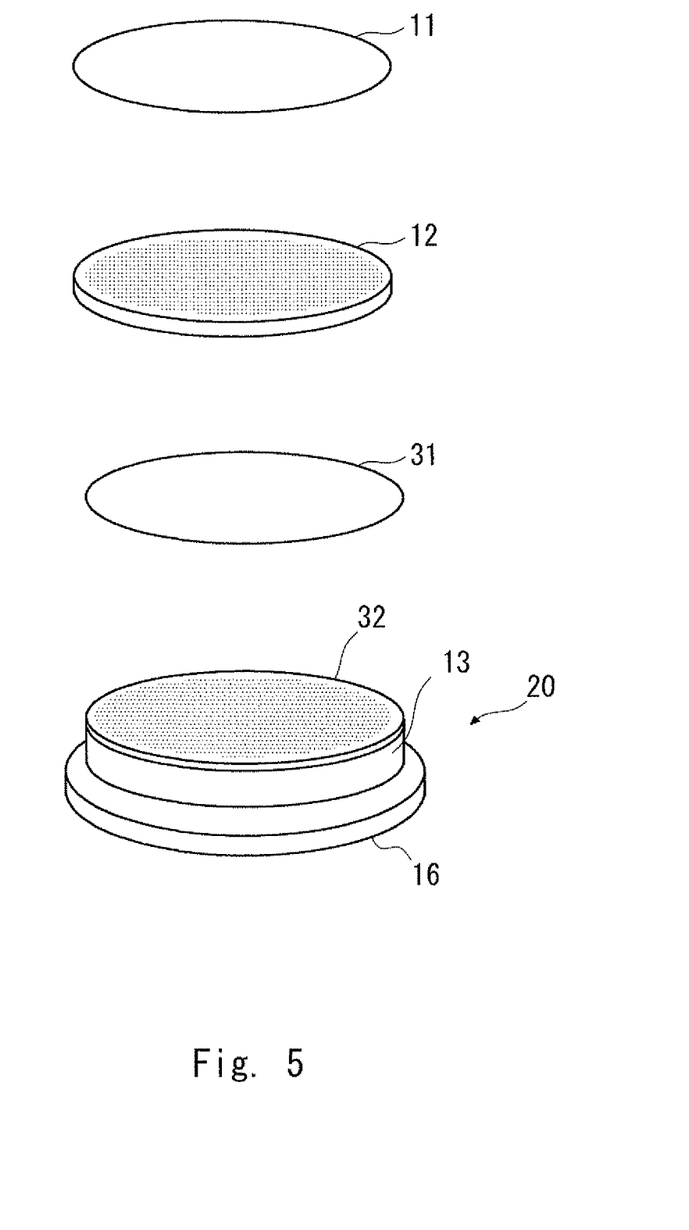
FIG. 5 is a perspective view for explaining each component of a chucking device according to a second embodiment.
Figure 6:
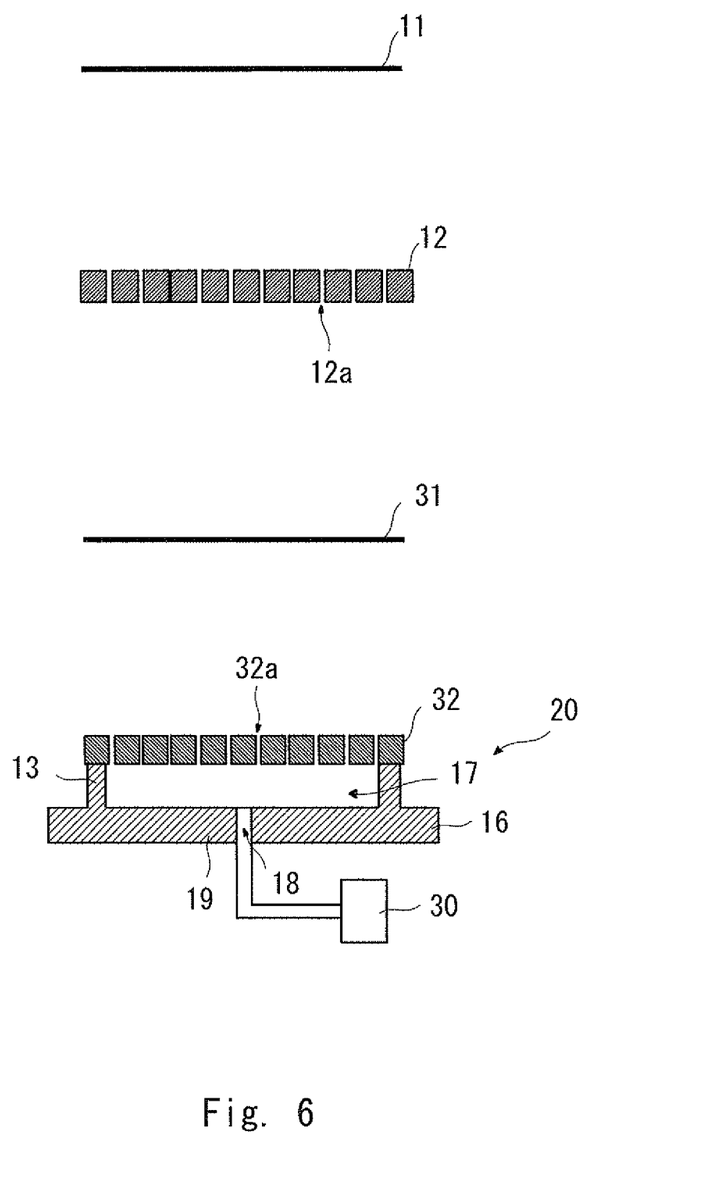
FIG. 6 is a sectional view schematically showing each component of the chucking device according to the second embodiment.

A second embodiment will be described with reference to FIGS. 5 and 6. FIG. 5 is a perspective view for explaining each component of a chucking device. FIG. 6 is a sectional view schematically showing each component of the chucking device. FIGS. 5 and 6 illustrate that the members are spaced apart as needed. As shown in FIGS. 5 and 6, in order to vacuum-suck a substrate, such as the wafer 11, the chucking device includes the perforated plate 12, a sheet member 31, a support plate 32, the support portion 20, and the vacuum pump 30. That is, the sheet member 31 and the support plate 32 are provided instead of the porous plate 21 of the first embodiment. Note that the description of the same components as those of the first embodiment will be omitted.

The support plate 32, which is a second plate, supports the sheet member 31, the perforated plate 12, and the wafer 11. The sheet member 31 is disposed between the support plate 32 and the perforated plate 12. In other words, the upper surface of the support plate 32 and the lower surface of the sheet member 31 are in contact with each other. The upper surface of the sheet member 31 and the lower surface of the perforated plate 12 are also in contact with each other. The sheet member 31 is sandwiched between the support plate 32 and the perforated plate 12.

The support plate 32 is a flat plate formed of metal, ceramic, or the like. The support plate 32 has a plurality of through-holes 32a formed therein. Since the support plate 32 is not a porous member, there is no need to seal the side surface thereof. Accordingly, the support plate 32 is placed on the upper surface of the side wall 13. Thus, the support portion 20 has no step portion 15. The support plate 32 may be disposed inside the side wall 13 in the same manner as that of the porous plate 21 of the first embodiment. Alternatively, the support plate 32 may be fixed to the support portion 20 by a screw or the like.

As with the porous plate 21, a porous material can be used for the sheet member 31. That is, the sheet member 31 functions as an orifice that limits the exhaust velocity. The sheet member 31 supports a surface other than the wafer mounting surface of the perforated plate 12 transmits a vacuum state to the wafer 11 through the plurality of through-holes 12a, and has an orifice to control the conductance. As in the first embodiment, this configuration enables reliable chucking. Specifically, a PTFE (polytetrafluoroethylene) membrane is preferably used for the sheet member 31. The use of a sheet-like porous material having a thickness smaller than that of the perforated plate 12 and the support plate 32 eliminates the need for sealing of the side surface.

A porous membrane or a fiber filter can be used for the sheet member 31. The sheet member 31 may be formed of a material other than the porous material. For example, it is possible to use a perforated metal foil obtained by forming fine pores by etching in a metal foil having a thickness of 50 to 100 μm. Various members, such as a film, a membrane, a filter, paper, and non-woven fabric, can be used as the sheet member 31.

The support plate 32 is placed on the side wall 13. At the bottom portion 19, which is disposed on the lower side of the perforated plate 12, the exhaust port 18 that communicates with the space 17 formed immediately below the support plate 32 is provided. The sheet member 31 is placed on the support plate 32. The perforated plate 12 is disposed on the sheet member 31. The wafer 11 is disposed on the perforated plate 12.

Accordingly, the vacuum pump 30 exhausts a gas within the through-holes 12a through the through-holes 32a and the sheet member 31. The wafer 11 disposed on the through-holes 12a can be vacuum-sucked through the sheet member 31. As a result, the same effect as that of the first embodiment can be obtained. Further, since in the configuration the sheet member 31 is sandwiched between the two plates in the vertical direction, the sheet member 31 can be made extremely thin. Furthermore, the perforated plate 12 and the support plate 32 are formed of dense materials, thereby making it possible to reduce the entire thickness of the chucking device. Therefore, the wafer surface can be formed with a lower height, and a stage with a low center of gravity can be achieved.

The use of a PTFE membrane or the like for the sheet member 31 enables the sheet member 31 to function as a particle filter. In the case of dismounting the wafer 11 from the chucking device, for example, a gas is supplied to the space 17 so that a pressure of the space 17 is made a positive pressure. At this time, particles within pipes or the like are prevented from flowing out to the outside space from the through-holes 12a. This prevents contamination due to particles. In this manner, the sheet member 31 serving as a filter can be disposed near the wafer 11, thereby preventing contamination.

Moreover, the sheet member 31 is sandwiched between the perforated plate 12 and the sheet member 31, thereby making it possible to prevent deformation of the sheet member 31 and to prevent the gas from flowing in the lateral direction parallel to the wafer 11. Accordingly, chucking can be reliably performed even when the extremely thin sheet material 31 is used.

The through-holes 12a of the perforated plate 12 and the through-holes 32a of the support plate 32 may be formed so as to completely or partially overlap each other. The exhaust velocity can be adjusted by shifting the positions of the through-holes 12a of the perforated plate 12 and the through-holes 32a of the support plate 32. For example, an overlapping area between the through-holes 12a and the through-holes 32a is changed by rotating the perforated plate 12 or the support plate 32 about an axis perpendicular to the perforated plate 12. Thus, the exhaust velocity can be adjusted by changing the overlapping area between the through-holes 12a and the through-holes 32a. This makes it possible to control and more reliably adjust the flow rate of the exhausted gas to a desired value.

Figure 7:
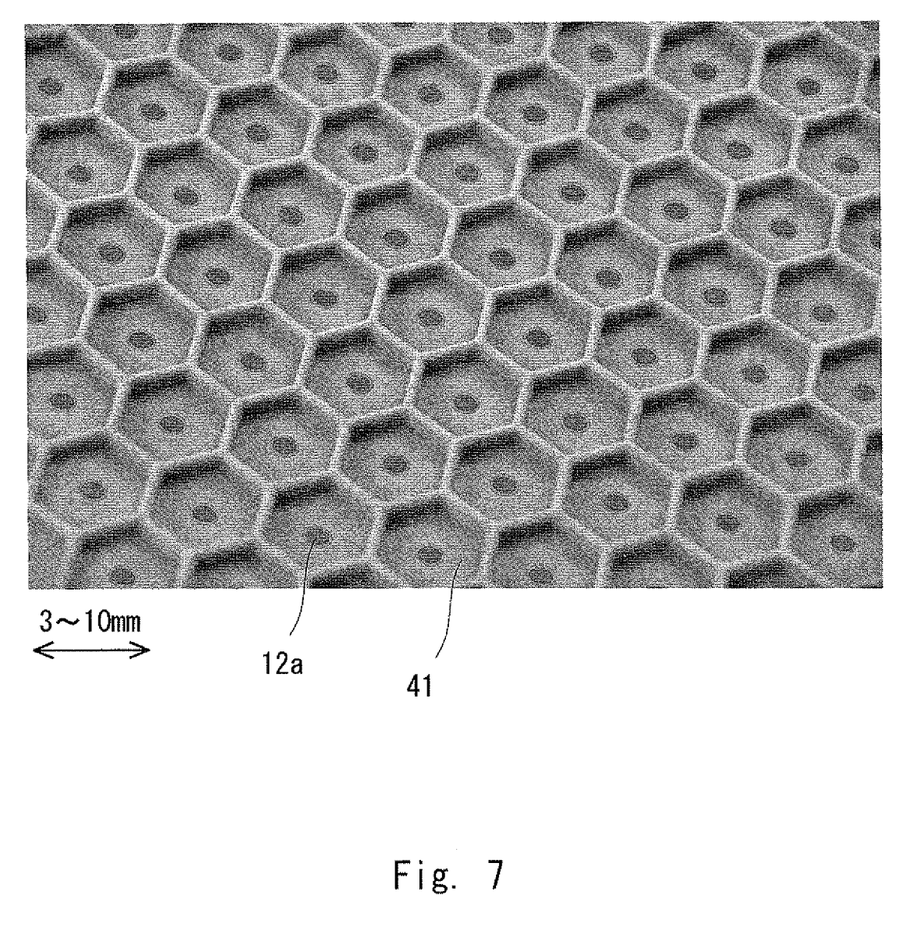
FIG. 7 is an enlarged view of a surface shape of a plate.

A configuration example in which the contact area between the perforated plate 12 and the wafer 11 can be reduced in the first and second embodiments will be described with reference to FIG. 7. FIG. 7 is an enlarged view of the upper surface of the perforated plate 12. A blasting process is performed on the perforated plate 12, which is formed of SiC, thereby arranging a plurality of recesses 41 in the surface of the perforated plate 12. For example, the recesses 41 may have a size of about 3 to 10 mm and a depth of 100 μm. Each through-hole 12a is formed in a part of the bottom surface of each recess 41. In this case, each through-hole 12a having a circular shape is formed at the center of each recess 41. Each through-hole 12a has a diameter of, for example, about 1 to 3 mm. In this manner, patterning of the surface of the perforated plate 12 enables reduction of the contact area and further prevents contamination.

It is also possible to vacuum-suck substrates other than a silicon wafer. For example, a GaN-on-Si wafer having a large warpage can also be vacuum-sucked.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A chucking device that vacuum-sucks and holds a substrate, the chucking device comprising:
    a first plate having a plurality of through-holes and being mounted with a substrate, the plurality of through-holes penetrating through both sides of the first plate;
    a member that supports a surface other than a substrate mounting surface of the first plate, transmits a vacuum state to the substrate through the plurality of through-holes, and limits a conductance;
    an exhaust unit that exhausts air through the member and the plurality of through-holes of the first plate; and
    a second plate having a plurality of through-holes and disposed on a side of the member opposite to the first plate,
    wherein the exhaust unit vacuum-sucks the substrate through the through-holes of the second plate, and
    wherein the member is a sheet member having a thickness smaller than that of the first and second plates.

2. The chucking device according to claim 1, wherein the member is a PTFE membrane.

3. The chucking device according to claim 1, further comprising a support member on which the first plate is detachably placed.

4. The chucking device according to claim 1, wherein the first plate is formed of a dense material.

5. The chucking device according to claim 1, wherein the member is formed of a porous material.

6. The chucking device according to claim 1, wherein the member has one of an orifice and a pore to limit a conductance.

7. A method for chucking a substrate by using a chucking device according to claim 1, the method comprising:
vacuum sucking the substrate; and
holding the substrate.

8. A chucking device that vacuum-sucks and holds a substrate, the chucking device comprising:
a first plate having a plurality of through-holes and being mounted with a substrate, the plurality of through-holes penetrating through both sides of the first plate;
a member that supports a surface other than a substrate mounting surface of the first plate, transmits a vacuum state to the substrate through the plurality of through-holes, and limits a conductance;
an exhaust unit that exhausts air through the member and the plurality of through-holes of the first plate; and
a support portion by which the first plate is detachably supported;
wherein upper surfaces of the member and the support portion serve as a mounting surface on which the first plate is placed, and
wherein the first plate is placed on the upper surfaces of the member and the support portion without an adhesive material so that the first plate can be dismounted from the support portion.

9. The chucking device according to claim 8, wherein a pin is formed on an upper surface of a side wall of the support portion,
wherein a hole is formed at a periphery of the first plate, and
wherein the pin is inserted into the hole to fix the first plate to the support portion.

10. The chucking device according to claim 8, wherein the first plate is fixed to the support portion by a screw.

11. The chucking device according to claim 8, wherein the first plate is formed of a dense material.

12. The chucking device according to claim 8, wherein the member is formed of a porous material.

13. The chucking device according to claim 12, wherein the member is a porous ceramic plate.

14. A method for chucking a substrate by using a chucking device according to claim 8, the method comprising:
vacuum sucking the substrate; and
holding the substrate.

* * * * *